United States Patent
Sun et al.

(10) Patent No.: US 6,396,357 B1
(45) Date of Patent: *May 28, 2002

(54) LOW VOLTAGE DIFFERENTIAL VOLTAGE-CONTROLLED RING OSCILLATOR

(75) Inventors: Lizhong Sun, Emmaus; Dale Nelson, Macungie, both of PA (US)

(73) Assignee: Agere Systems Guardian Corp., Allentown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/562,305

(22) Filed: May 1, 2000

(51) Int. Cl.[7] ................................................ H03B 5/24
(52) U.S. Cl. .................... 331/57; 331/34; 331/177 R; 331/185; 327/109; 327/543
(58) Field of Search ........................ 331/34, 57, 177 R, 331/185, 186; 327/108, 109, 530, 538, 543, 276, 280, 281

(56) References Cited

U.S. PATENT DOCUMENTS

| | | | | |
|---|---|---|---|---|
| 5,142,249 A | * | 8/1992 | Hirotomi | 331/57 |
| 5,440,277 A | * | 8/1995 | Ewen et al. | 331/176 |
| 5,514,989 A | * | 5/1996 | Sato et al. | 327/109 |
| 5,710,527 A | * | 1/1998 | Yaguchi et al. | 331/57 |
| 5,831,486 A | * | 11/1998 | Wehbi | 331/57 |
| 5,952,892 A | * | 9/1999 | Sajada | 331/57 |
| 6,011,443 A | * | 1/2000 | Chen et al. | 331/57 |

OTHER PUBLICATIONS

Patrik Larson, "A 2–1600–MHz CMOS Clock Recovery PLL with Low–Vdd Capability", *IEEE Journal of Solid–State Circuits*, vol. 34, No. 12, Dec. 1999, pp. 1951–1960.
Lizhong Sun and Tad Kwasniewski, "A 1.25GHz 0.35μm Monolithic CMOS PLL Clock Generator for Data Communications", IEEE 1998 Custom Integrated Circuits Conference, pp. 265–268.
J.G. Maneatis and M.A. Horowitz, "Precise Delay Generation Using Coupled Oscillators", *IEEE Journal of Solid–State Circuits*, vol. 28, No. 12, Dec. 1993, pp. 1273–1282.
A.W. Buchwald, K.W. Martin, A.K. Oki and K.W.Kobayashi, A 6–Ghz Integrated Phase–Locked Loop Using AlGaAs/GaAs Heterojunction Bipolar Transistors, *IEEE Journal of Solid–State Circuits*, vol. 27, No. 12, Dec. 1992, pp. 1752–1762.
B. Kim, D.N. Helman and P.R. Gray, "A 30–MHz Hybrid Analog/Digital Clock Recovery Circuit in 2μm CMOS", *IEEE Journal of Solid–State Circuits*, vol. 25, No. 6, Dec. 1990, pp. 1385–1394.

* cited by examiner

*Primary Examiner*—David Mis
(74) *Attorney, Agent, or Firm*—Duane Morris LLP

(57) ABSTRACT

A ring oscillator including a voltage-to-current converter for producing at least one control current from at least one control voltage and, a plurality of delay cells coupled to the converter, wherein at least one output of the one of the delay cells is coupled to the input of another of the delay cells, wherein the voltage-to-current converter produces a substantially linear output when the at least one control voltage is varied between zero volts and a rail supply voltage. Since the ring oscillator operates from a low voltage source, it can be used in applications where power supply (e.g., battery size) is small (e.g., pagers, cellular phone applications).

12 Claims, 4 Drawing Sheets

LOW VOLTAGE DIFFERENTIAL VOLTAGE-CONTROLLED RING OSCILLATOR

FIELD OF THE INVENTION

The present invention relates to oscillators, and in particular, to voltage-controlled ring oscillators.

DESCRIPTION OF THE RELATED ART

The voltage-controlled oscillator (VCO) is an important building block in PLLs, clock recovery circuits, and frequency synthesizers. High frequency and radio frequency (RF) voltage-controlled oscillators can be implemented monolithically as LC oscillators, as relaxation oscillators and ring oscillators. Although ring oscillators tend to have poor phase noise characteristics compared to high Q LC oscillators, they have the advantage of a wider range of oscillation, and ease of monolithic integration which results in small semiconductor die size. Ring oscillators are particularly attractive for quadrature clocks and multiphase clock signal generation required for conventional clock recovery circuits and high-speed sampling systems.

Ring oscillators are frequently used in the prior art to generate high frequency clock signals. As referred to above, ring oscillators may be controlled by a voltage or current source to generate a variable frequency signal. Most conventional voltage or current-controlled ring oscillators are nonlinear in frequency. In particular, as the input control voltage or current signal to these ring oscillators varies, the oscillation frequency of the circuit does not respond linearly.

Briefly, a ring oscillator consists of multiple stages of amplification and delay that are connected in tandem, with the last stage coupled back to the first stage in the form of a ring around which the signals propagate. Each stage of the ring oscillator provides a phase shift. In particular, each half period the signal will propagate around the delay cell ring with an inversion. Ring oscillators can be implemented using differential pair or current-starved single-ended inverter structures. However, while differential pair structures reject power supply noise well, the frequency range and voltage swing may not be sufficient for some applications (particularly low voltage applications). Current-starved single-ended inverter structures are also sensitive to power supply noise. Although a voltage regulator can be utilized to reduce the effect of power supply noise, it is typically undesirable to use a regulator in low voltage applications.

It has been recognized in the prior art that it is beneficial to use differential amplifiers for each of the stages of the ring oscillator in order to cause the oscillator to be more immune to the influence of spurious noises in the form of voltage and current spikes that might be coupled to both sides of the differential circuit. Such a spurious noise from the power supply, for example, would be coupled to both sides of the differential amplifier, and it would therefore affect both of the sides of the differential stages substantially equally. Consequently, the effect of such spurious noise is minimized on the output of the oscillator, which can be taken as the difference of the outputs of any one of the stages.

Two problems associated with using differential amplifiers in a ring oscillators are differential mode lockup and common mode lockup. Differential mode lockup refers to the phenomenon that occurs where each stage (differential amplifier) of the ring oscillator would end up with its output at either the opposite voltage limits or at the same voltage limit as the other stages. However, differential mode lockup typically only occurs in a ring oscillator with an even number of stages (e.g., 2, 4, 6, etc.). For example, in a simple two stage ring oscillator, differential lockup could occur with the first output of stage one and the second output of stage two sitting at one voltage limit while the second output of stage one and the first output of stage two are sitting at the opposite voltage limit. Common mode lockup could occur with the first and second outputs of stage one sitting near one voltage limit while the first and second outputs of stage two are sitting near the opposite voltage limit.

Differential mode lockup can be prevented in a ring oscillator using an even number of stages by crossing the connections made between the outputs and the inputs for one pair (or an odd number of pairs) of connections in the ring oscillator. As a result, an additional phase inversion is provided in the differential signal path, and lockup of the oscillator on a differential basis is prevented.

Voltage-controlled ring oscillators (VCROs) are well known and are used for various purposes in the art. Although there are many different types of voltage-controlled ring oscillators are known in the prior art, most operate at relatively high input voltages (e.g., 3–10 Volts). In some applications (e.g., pagers, cellular phones), it may be necessary to operate a VCRO from a low voltage source (e.g., 1–2 Volts) to reduce the power consumption.

Low power is a key requirement in PLLs which use batteries as a power supply, since battery lifetime can affect talk time in portable wireless communication (e.g., cellular) devices. As stated above, conventional differential pair and current-starved single-ended inverter structures are not well suited for low voltage applications.

Therefore, there is currently a need for a voltage-controlled ring oscillator structure which operates from a relatively low voltage source.

SUMMARY OF THE INVENTION

The present invention is a ring oscillator including a voltage-to-current converter for producing at least one control current from at least one control voltage and, a plurality of delay cells coupled to the converter, wherein at least one output of the one of the delay cells is coupled to the input of another of the delay cells, wherein the voltage-to-current converter produces a substantially linear output when the at least one control voltage is varied between zero volts and a rail supply voltage.

The above and other advantages and features of the present invention will be better understood from the following detailed description of the preferred embodiments of the invention which is provided in connection with the accompanying drawings.

DETAILED DESCRIPTION

Figure 1:
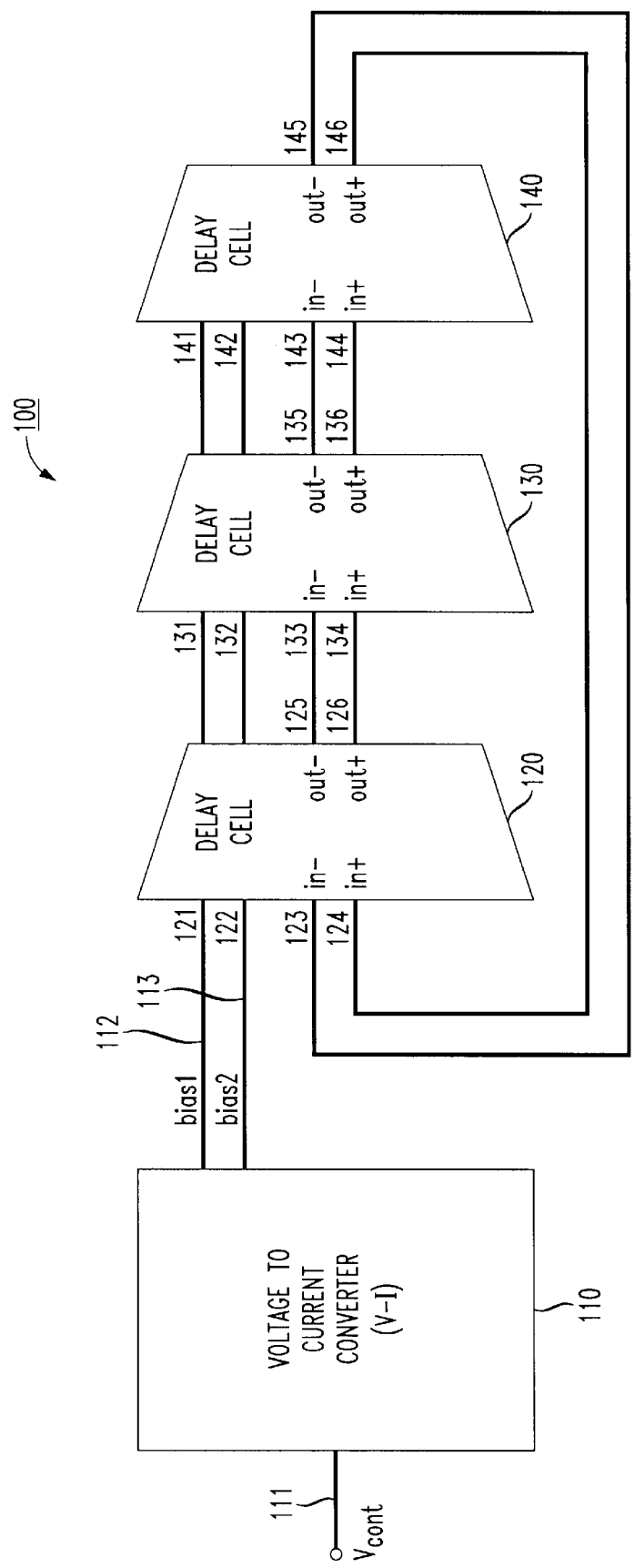
FIG. 1 is a voltage-controlled ring oscillator according to a first exemplary embodiment of the present invention.

Referring to FIG. 1, there is shown a voltage-controlled ring oscillator (VCRO) 100 according to a first exemplary embodiment of the present invention. The VCRO 100 includes a voltage-to-current converter 110 which converts a control voltage $V_{cont}$ into a control current $I_{cont}$, and thereafter to a bias voltage $V_{bias}$. In the present invention, the control voltage $V_{cont}$ is preferably within a range from zero (0) to a rail supply voltage $V_{dd}$ (e.g., 2 volts), to allow low voltage operation of the VCRO 100, but it should be noted that the control voltage may be in any suitable range. The voltage-to-current converter 110 includes a input terminal 111 (for accepting the control voltage $V_{cont}$), and two output terminals 112, 113 (for providing a bias voltage $V_{bias}$ on lines bias$_1$ and bias$_2$). The VCRO 100 also includes a ring of delay cells 120–140. Although only three delays cells 120–140 are shown in FIG. 1, those of ordinary skill in the art will recognize that any number of delay cells (e.g., 3, 4, 5, etc.) may be utilized with the present invention.

A first set of inputs 121, 122 of the first delay cell 120 are coupled to the outputs 112, 113 of the voltage-to-current converter 110. Additionally, a first set of inputs 131, 132 for the second delay cell 130 and a first set of inputs 141, 142 for the third delay cell 140 are also coupled to the outputs 112, 113 of the voltage-to-current converter 110. As will be understood, the outputs 112, 113 provide a bias voltage $V_{bias}$ (generated from the control current $I_{cont}$) to all the delay cells 120–140.

The first delay cell 120 also includes a second set of inputs 123, 124 (labeled in– and in+, respectively) which are coupled to outputs 145, 146 of the third (last) delay cell 140. A first set of outputs 125, 126 of the first delay cell 120 are coupled to second inputs 133, 134 of the second delay cell 130. A first set of outputs 135, 136 of the second delay cell 130 are coupled to second inputs 143, 144 of the third delay cell 140. As stated above, the first set of outputs 145, 146 of the third delay cell 140 are coupled to the second set of inputs 123, 124 of the first delay cell 120 to form a ring. As can be seen from the above, any suitable number of delay cells can be coupled to one another to form a ring, so long as the outputs of the last delay cell are coupled to the inputs of the first delay cell. Further, if an even number of delay cells (e.g., 4) are utilized, the inversion required around the ring can be achieved by simply interchanging the outputs (out+, out–) of the last delay cell (e.g., delay cell 140) before feeding them back to the inputs (in+, in–) of the first delay cell (e.g., delay cell 120).

The operation of the VCRO 100 is as follows. As the control voltage $V_{cont}$ is varied, the control current $I_{cont}$ (and a bias voltage $V_{bias}$ provided on lines bias$_1$ and bias$_2$) supplied to the ring of delay cells 120–140 is altered, thereby altering the frequency of the signal presented at the outputs (e.g., 125, 126, 135, 136, 145, 146) of each of the delay cells 120–140. Typically, an oscillating output signal will be taken from the outputs (e.g., 145, 146) of last delay cell in the ring (e.g. cell 140). However, it also often desirable to utilize all the outputs of the delay cells 120–140.

Figure 2:
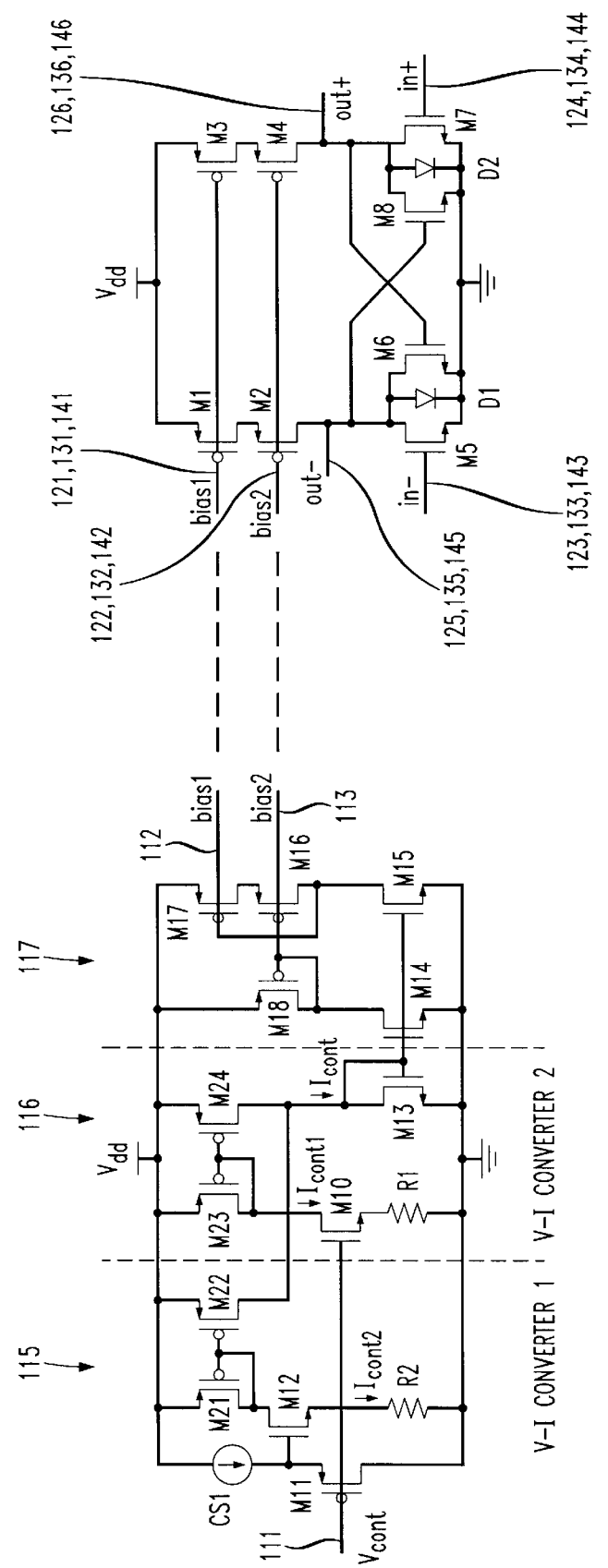
FIG. 2 shows the structure of the voltage-controlled oscillator of FIG. 1 in detail.

FIG. 2 shows the details of the voltage-to-current converter 110 and the delay cells 120–140 shown in FIG. 1. As can be seen, the control voltage $V_{cont}$ is coupled to a first voltage-to-current converting stage 115 (labeled V-I converter 1), which is in turn coupled to a second voltage-to-current converting stage 116 (labeled V-I converter 2). An output stage 117 couples the first and second voltage-to-current converting stages 115 and 116 to the lines bias$_1$ and bias$_2$, and thereby produces a bias voltage $V_{bias}$ from the control current $I_{cont}$. As explained below, the output stage 117 combines the currents generated in the first and second stages 115, 116 to generate the control current $I_{cont}$ which is used to create the bias voltage $V_{bias}$ on lines bias$_1$ and bias$_2$.

The first voltage-to-current converting stage 115 includes a first p-channel Metal-Oxide Semiconductor Field Effect Transistor (MOSFET) M11 which has a gate coupled to the control voltage $V_{cont}$. A source of MOSFET M11 is coupled to a current source CS1, and a drain of the MOSFET M11 is coupled to ground. The current source CS1 is coupled to a rail supply voltage $V_{dd}$ which supplies the current source and the various transistors. In the preferred embodiment, the rail supply voltage $V_{dd}$ is in a range from 0.01 to 2 volts (for low voltage operation of the VCRO 100), but it should be noted that the supply voltage may be within any suitable range. Also coupled to the source of the MOSFET M11 is a first n-channel MOSFET M12 which has a source coupled to ground through a first resistor R2. A drain of the MOSFET M12 is coupled to a drain of a second a p-channel MOSFET M21 and to a junction which feeds a gate of MOSFET M21 and a gate of a third p-channel MOSFET M22. The sources of the MOSFETs M21 and M22 are coupled to the supply voltage $V_{dd}$.

The second voltage-to-current converting stage 116 includes a second n-channel MOSFET M10 which has a gate coupled to the control voltage $V_{cont}$. A source of MOSFET M10 is coupled to ground through a second resistor R1. A drain of the MOSFET M10 is coupled to a drain of a fourth p-channel MOSFET M23, and to a junction which feeds a gate of MOSFET M23 and a gate of a fifth p-channel MOSFET M24. As with the MOSFETs M21 and M22, the sources of the MOSFETs M23 and M24 are coupled to the supply voltage $V_{dd}$.

The drain of MOSFET M22 from the first stage 115 is coupled to the drain of MOSFET M24 as well as a drain of a third n-channel MOSFET M13 and a junction which feeds the gates of MOSFET M13 and a fourth n-channel MOSFET M14, which is part of an output stage 117 of the voltage-to-current converter 110, explained below.

As stated above, the voltage-to-current converter 110 also includes an output stage 117 which is coupled to the first and second voltage-to-current converting stages 115, 116. Also as stated above, the output stage 117 includes a fourth n-channel MOSFET M14 which is coupled to the first and second stages 115, 116. The output stage 117 also includes a fifth n-channel MOSFET M15 with a gate coupled to the gate of MOSFET M13. A source of the MOSFET M15 is coupled to ground, and a drain of MOSFET M15 is coupled to a drain of a sixth p-channel MOSFET M16 and to a gate of a seventh p-channel MOSFET M17. The drain of MOSFET M14 is coupled to a drain of a eighth p-channel MOSFET M18, as well as a junction which feeds the gates of MOSFET M18 and M16. The sources of the MOSFETs M17 and M18 are coupled to the supply voltage $V_{dd}$.

Each delay cell 120–140 has a structure as shown on the right-hand side of FIG. 2. The first set of input terminals (121, 122; 131, 132; 141, 142) for each delay cell are coupled to the gates of first through fourth p-channel MOSFETs M1–M4 as shown. The sources of the MOSFETs M1, M3 are coupled to the supply voltage $V_{dd}$, and the sources of the MOSFETs M2, M4 are in turn coupled to the drains of the MOSFETs M1, M3. The drains of the MOSFETs are coupled to the first set of output terminals (125, 126; 135, 136; 145, 146; labeled out+ and out–), as well as to the drains of n-channel MOSFETs M5 and M7, and the gates of n-channel MOSFETs M6 and M8. Additionally, diodes D1 and D2 are coupled across the drain and source terminals of the MOSFETs M5–M8. The gates of the MOSFETs M6 and M8 are coupled to the second set of input terminals (123, 124; 133, 134; 143, 143; labeled in– and in+).

The operation of the delay cells 120–140 is as follows. When a voltage ($V_{in–}$) applied to the input terminals 123, 133, 143 of the delay cells 120–140 is high, and a voltage ($V_{in+}$) applied to the input terminals 124, 134, 144 of the delay cells is low, MOSFET M5 turns "on", sinking a left side portion of the biasing current $I_{cont}$ to ground. At the same time, MOSFET M7 turns "off", and a right side portion biasing current $I_{cont}$ is directed through diode D2. The resistance of MOSFET M5 defines a low level $V_1$ of the output voltage, and the resistance of the diode D2 defines a high level $V_2$ of the output voltage. Thus, the differential output voltage ($V_{out-}$, $V_{out-}$) has a voltage swing of $V_2-V_1$. Similarly, when $V_{in-}$ is low and $V_{in+}$ is high, MOSFET M5 turns "off", directing the left side biasing current $I_{cont}$ through diode D1, and the $V_{out-}$ voltage is at the (high) $V_2$ level. At the same time, MOSFET M7 turns "on", sinking the right side biasing current $I_{cont}$ to ground, and the $V_{out+}$ voltage is at the low $V_1$ level.

In the VCRO 100 according to the exemplary embodiment of the present invention, a parasitic capacitance which exists at each output node is alternatively charged and discharged by the control current $I_{cont}$. The oscillation period of the VCRO 100 is determined by the total delay around the ring of delay cells (e.g., 120–140). The nominal delay per stage (or cell) is determined by the following equation:

$$t_d \approx (C^* V_s)/(I_{cont}),$$

where $V_s$ is the output voltage swing ($V_2-V_1$), and C is the total parasitic capacitance at the output of each delay cell.

From the above equation, the oscillation frequency (f) can be determined:

$$f \approx 1/(2^*N^* t_d) = I_{cont}/(2^*N^*C^*V_s),$$

where N is the number of delay stages (cells).

The above equation shows that the frequency of the VCRO 100 is in proportion to the control current $I_{cont}$. Thus, when $I_{cont}$ is increased, oscillation frequency of the VCRO 100 increases, and when $I_{cont}$ is decreased, oscillation frequency of the VCRO decreases.

In the second voltage-to-current converter 116, the voltage to current conversion is realized using the n-channel MOSFET M10 connected in source-follower configuration, and applying the voltage across the resistor R1. The transconductance is linear and has a positive slope. Thus, the control current $I_{cont}$ is calculated using the following equations:

$$I_{cont1} = (V_{cont} - V_{th})/(R1), \quad \text{when } V_{th} < V_{cont} < V_{dd}, \qquad [\text{Eq. 1}]$$
$$0, \qquad \text{when } V_{cont} \leq V_{th},$$

where Vth is the threshold voltage of the MOSFET M10.

The above equation shows that the second voltage-to-current converter 116 has a first order linear control voltage range from approximately $V_{th}$ to $V_{dd}$.

In the first voltage-to-current converter 115, MOSFET M11 functions as a level shifter. With the proper bias and transistor size selection for MOSFETs M11 and M12, the gate-source voltage drop ($V_{gs}$) for MOSFET M11 equals the gate-source voltage drop for MOSFET M12, thus, $$I_{cont2} = (V_{cont})/(R2), \quad \text{when } 0 < V_{cont} < (V_{dd} - V_{th}) \qquad [\text{Eq. 2}]$$
$$0, \qquad \text{when } V_{cont} \geq V_{dd} - V_{th}$$

The above equation shows that the first voltage-to-current converter 115 has a first order linear control voltage range from approximately 0 to ($V_{dd}-V_{th}$). Combining the above equations, we have:

$$I_{cont} = I_{cont1} + I_{cont2} = (V_{cont})/(R), \quad \text{when } 0 < V_{cont} < V_{th} \qquad [\text{Eq. 3}]$$
$$(2V_{cont} - V_{th})/(R), \quad \text{when } V_{th} \leq V_{cont} \leq (V_{dd} - V_{th})$$
$$(V_{cont} - V_{th})/(R), \quad \text{when } (V_{dd} - V_{th}) < V_{cont} < V_{dd},$$

where $R = R1 = R2$

Thus, with the combination of the first and second voltage-to-current converters 115, 116, the voltage range is extended "rail-to-rail", from 0 to $V_{dd}$ (i.e., the supply voltage). The ability of the VCRO 100 to swing from 0 volts to $V_{dd}$ is important in low power supply ($V_{cont}$) applications, and large tuning range applications.

In order for the VCRO 100 to operate from a low supply voltage ($V_{dd}$) and a low control voltage ($V_{cont}$), only three MOSFETs (e.g., M1, M2, M5) are coupled serially between the power supply ($V_{dd}$) and ground. MOSFETs M5 and M7 preferably comprise differential input transistors, and MOSFETs M6 and M8 preferably comprise cross-coupled transistors used to maintain differential output and increase the gain of the delay cell. Diodes D1 and D2 are clamping diodes used to limit the output voltage swing of the delay cell. The MOSFETs M5–M8 can be implemented with gate-drain connected n-channel MOSFETs (or alternatively p-channel MOSFETs; see FIGS. 3–4). The cascoded p-channel MOSFETs M1–M4 are used as an active load. Other techniques for increasing the output impedance of the current sources known in the art may be employed.

Since the voltage swings in the VCRO 100 are not exactly "rail-to-rail" due to the clamping diodes D1, D2, the loads M1–M4 are in a 'saturated' state at all times, thereby reducing the noise injected from $V_{dd}$ to the output due to high output impedance. Alternatively, the cascoded MOSFETs (e.g., M1 and M2) can be replaced by a single MOSFET to simplify design, and to allow the VCRO 100 to operate at even lower power supply voltages ($V_{dd}$), however, output impedance will be decreased. Another benefit of the present VCRO 100 is that any ground noise coupled from other circuitry will be rejected by the delay cell as common mode noise since both outputs (out+, out−) and inputs (in+, in−) are referred to the same ground.

Figure 3:
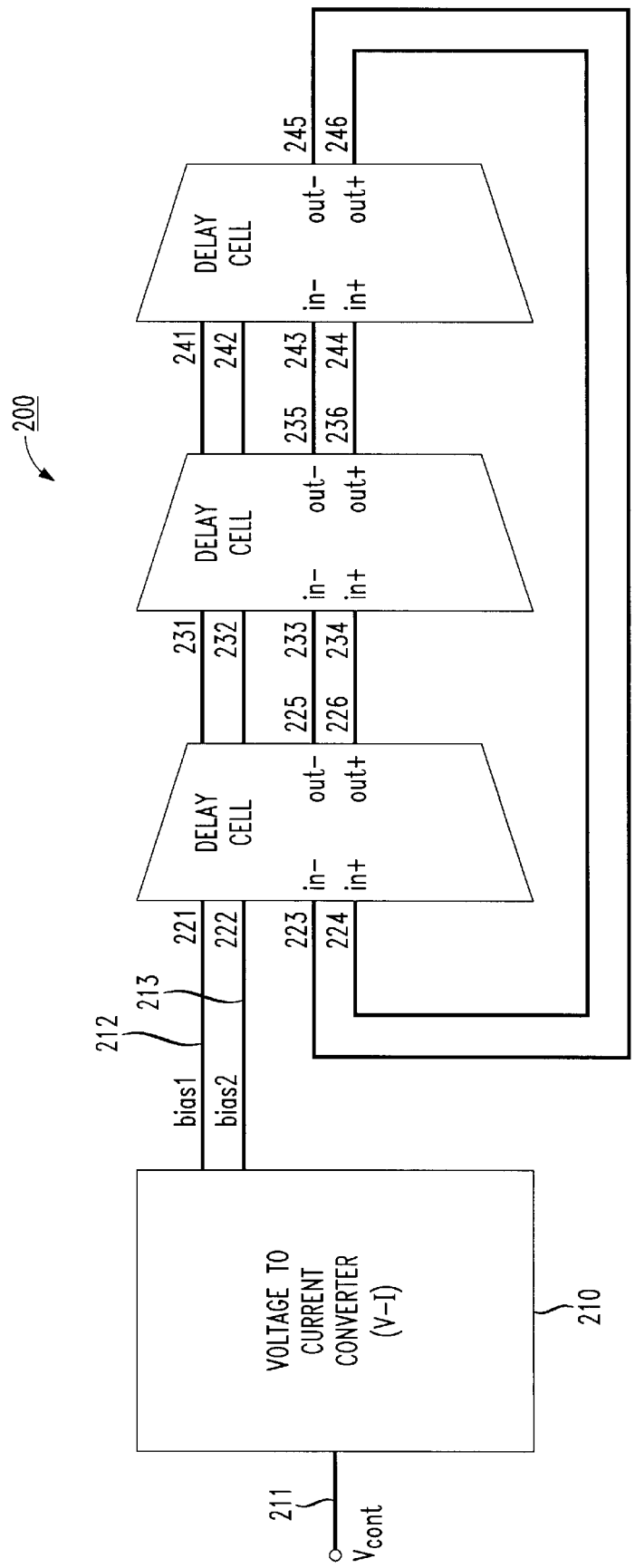
FIG. 3 is a voltage-controlled ring oscillator according to a second exemplary embodiment of the present invention.
Figure 4:
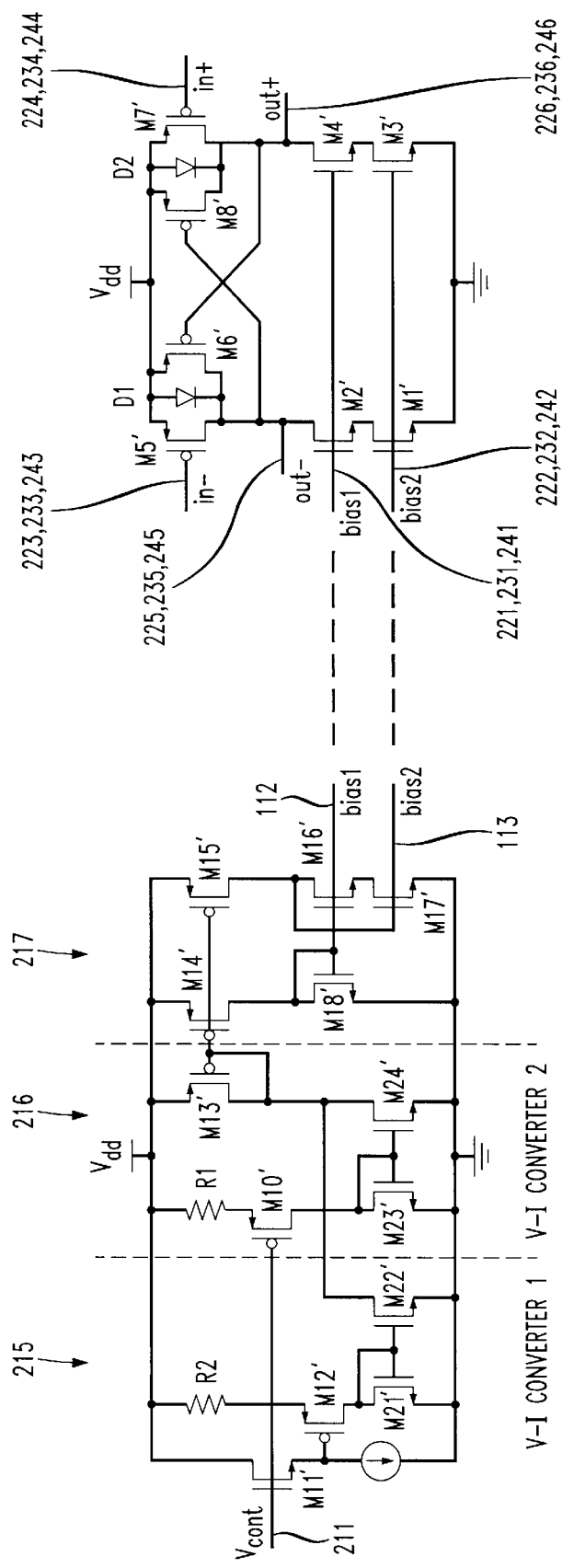
FIG. 4 shows the structure of the voltage-controlled oscillator of FIG. 3 in detail.

FIGS. 3 and 4 show a voltage-controlled ring oscillator (VCRO) 200 according to a second exemplary embodiment of the present invention. VCRO 200 includes essentially the same components as VCRO 100 (where like reference numerals indicate like elements), except that all the p-channel MOSFETs in VCRO 100 are n-channel MOSFETS in VCRO 200, and all the n-channel MOSFETs in VCRO 100 are p-channel MOSFETs in VCRO 200. Additionally, the connections with respect to ground and Vdd are reversed in VCRO 200 with respect to VCRO 100. The VCRO 200 provides essentially the same functionality as VCRO 100, and therefore a detailed description is omitted here.

Thus, the present invention provides a voltage-controlled ring oscillator (VCRO) which operates from a low voltage power source (e.g., $V_{dd} \approx 1.5$ Volts), but which also allows high speed operation (up to approximately 3 Gigahertz (GHz)). Further, the present invention allows "rail-to-rail" control of the input control voltage ($V_{cont}$) and has low sensitivity to noise from the power supply.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A ring oscillator comprising:
   a voltage-to-current converter for producing at least one control current from at least one control voltage; and,
   a plurality of delay cells coupled to the converter, wherein at least one output of the one of the delay cells is coupled to the input of another of the delay cells,
   wherein the voltage-to-current converter produces a substantially linear output when the at least one control voltage is varied between zero volts and a rail supply voltage,
   wherein the voltage-to-current converter includes at least two stages, a first stage for producing a first component of the control current, and a second stage for producing a second component of the control current,
   wherein the first stage of the voltage-to-current converter comprises:
      a first transistor having a gate terminal coupled to the at least one control voltage;
      a second transistor having a gate terminal coupled to a source of the first transistor;
      a third transistor having a gate terminal and a drain terminal coupled to a drain of the second transistor; and,
      a fourth transistor having a gate terminal coupled to the drain of the second transistor.

2. The ring oscillator of claim 1, wherein the at least one control voltage is in a range from zero volts to approximately 2 volts.

3. The ring oscillator of claim 1, wherein the at least one control voltage is in a range from 0.01 volts to 1.5 volts.

4. The ring oscillator of claim 1, wherein the first, second, third and fourth transistors comprise Metal-Oxide Semiconductor Field Effect Transistors.

5. The ring oscillator of claim 1, wherein the rail supply voltage is in a range from zero to 2 volts.

6. A ring oscillator comprising:
   a voltage-to-current converter for producing at least one control current from at least one control voltage; and,
   a plurality of delay cells coupled to the converter, wherein at least one output of the one of the delay cells is coupled to the input of another of the delay cells,
   wherein the voltage-to-current converter produces a substantially linear output when the at least one control voltage is varied between zero volts and a rail supply voltage,
   wherein the voltage-to-current converter includes at least two stages, a first stage for producing a first component of the control current, and a second stage for producing a second component of the control current,
   wherein the second stage of the voltage-to-current converter comprises:
      a first transistor having a gate terminal coupled to the at least one control voltage;
      a second transistor having a gate terminal coupled to a drain of the first transistor; and,
      a third transistor having a gate terminal coupled to a drain of the first transistor.

7. The ring oscillator of claim 6, wherein the second stage of the voltage-to-current converter further comprises:
   a fourth transistor having a drain terminal coupled to a drain terminal of the third transistor.

8. The ring oscillator of claim 7, wherein the first, second, third and fourth transistors comprise Metal-Oxide Semiconductor Field Effect Transistors.

9. A ring oscillator comprising:
   a voltage-to-current converter for producing at least one control current from at least one control voltage; and,
   a plurality of delay cells coupled to the converter, wherein at least one output of the one of the delay cells is coupled to the input of another of the delay cells,
   wherein the voltage-to-current converter produces a substantially linear output when the at least one control voltage is varied between zero volts and a rail supply voltage, and wherein each of the plurality of delay cells comprise:
      at least four transistors having their gates coupled to a bias voltage generated from the control current; and,
      at least two differential input transistors; and,
      at least two cross-coupled transistors.

10. The ring oscillator of claim 9, wherein each of the plurality of delay cells additionally comprise:
    at least two diodes for limiting voltage swing.

11. The ring oscillator of claim 9, wherein the at least four transistors, the at least two differential input transistors and the at least two cross-coupled transistors comprise Metal-Oxide Semiconductor Field Effect Transistors.

12. A ring oscillator comprising:
    a voltage-to-current converter for producing at least one control current from at least one control voltage; and,
    a plurality of delay cells coupled to the converter, wherein at least one output of the one of the delay cells is coupled to the input of another of the delay cells, wherein the voltage-to-current converter produces a substantially linear output when the at least one control voltage is varied between zero volts and a rail supply voltage,
    wherein each of the plurality of delay cells includes:
       at least one first input terminal;
       at least one second input terminal; and,
       at least one first output terminal, and
    wherein the at least one first input terminal, the at least one second input terminal and the at least one first output terminal each comprise a pair of terminals.

* * * * *